United States Patent
Ben-Rubi

(10) Patent No.: US 12,165,735 B2
(45) Date of Patent: Dec. 10, 2024

(54) DATA STORAGE WITH IMPROVED CACHE READ

(71) Applicant: Western Digital Technologies, Inc., San Jose, CA (US)

(72) Inventor: Refael Ben-Rubi, Rosh Haayln, IL (US)

(73) Assignee: Sandisk Technologies, Inc., Milpitas, CA (US)

( * ) Notice: Subject to any disclaimer, the term of this patent is extended or adjusted under 35 U.S.C. 154(b) by 174 days.

(21) Appl. No.: 17/956,784

(22) Filed: Sep. 29, 2022

(65) Prior Publication Data

US 2024/0112706 A1    Apr. 4, 2024

(51) Int. Cl.
*G11C 7/22*     (2006.01)
*G11C 7/10*     (2006.01)
*G11C 29/52*    (2006.01)

(52) U.S. Cl.
CPC .......... *G11C 7/1063* (2013.01); *G11C 7/1069* (2013.01); *G11C 7/22* (2013.01); *G11C 29/52* (2013.01)

(58) Field of Classification Search
CPC ....... G11C 7/1063; G11C 7/1069; G11C 7/22; G11C 29/52; G11C 29/023; G11C 29/50012; G11C 29/028; G06F 13/1689
See application file for complete search history.

(56) References Cited

U.S. PATENT DOCUMENTS

| | | |
|---|---|---|
| 7,571,276 B2 | 8/2009 | Cho et al. |
| 9,431,119 B2 | 8/2016 | Hyun et al. |
| 9,892,032 B2 | 2/2018 | Benisty et al. |
| 10,459,844 B2 | 10/2019 | Benisty et al. |
| 10,838,887 B2 | 11/2020 | Suzuki et al. |
| 11,099,783 B2 | 8/2021 | Sia et al. |
| 2020/0233606 A1 * | 7/2020 | Duan ................. G06F 1/10 |

* cited by examiner

*Primary Examiner* — Xiaochun L Chen
(74) *Attorney, Agent, or Firm* — PATTERSON + SHERIDAN, LLP

(57) ABSTRACT

The present disclosure generally relates to optimizing memory storage performance and power usage. Read operations from flash memory are comprised of a sense operation and a read transfer operation. Usually, these two operations are performed in parallel to achieve high read performance. However, these two operations typically do not take the same amount of time, leading to inefficiencies. By measuring sense busy time, the read transfer clock may be set accordingly so the two operations are equal in time. In so doing, the system will be optimized from both a performance and power consumption point of view.

20 Claims, 4 Drawing Sheets

DATA STORAGE WITH IMPROVED CACHE READ

BACKGROUND OF THE DISCLOSURE

Field of the Disclosure

Embodiments of the present disclosure generally relate to optimizing memory storage performance and power usage.

Description of the Related Art

The main operations of memory storage are read and write operations. The performance of read operations are of interest to users of the device. Every micro second effects performance.

Read operations from flash memory are comprised of a sense operation and a read transfer operation. The sense operation retrieves data from a flash array to the internal RAM in the flash. The read transfer operation copies the data from the internal RAM in the flash to the controller RAM and, after decoding, to the user or a host device.

To achieve high performance, the sense and read transfers are performed in parallel. The controller senses a page N+1 to retrieve data and copy it to the internal RAM in flash, while the read transfer operation copies the data of a previous page N to the controller's internal RAM or application specific integrated circuit (ASIC).

However, these two operations typically do not take the same amount of time. In those scenarios, the memory storage is not performing optimally. If the sense time is lower, the performance is bottlenecked with the read transfer operation, which decreases performance. If the transfer time is lower, there is too much power being provided to the read transfer clock, as the device still needs to wait for the sense operation to complete.

Therefore, there is a need in the art for optimization of performance for flash memory storage while performing read operations.

SUMMARY OF THE DISCLOSURE

The present disclosure generally relates to optimizing memory storage performance and power usage. Read operations from flash memory are comprised of a sense operation and a read transfer operation. Usually, these two operations are performed in parallel to achieve high read performance. However, these two operations typically do not take the same amount of time, leading to inefficiencies. By measuring sense busy time, the read transfer clock may be set accordingly so the two operations are equal in time. In so doing, the system will be optimized from both a performance and power consumption point of view.

In one embodiment, a data storage device comprises: a memory device; and a controller coupled to the memory device, wherein the controller is configured to: collect information about current transfer size of a read operation; determine an expected busy time, wherein the expected busy time is a time to perform a sense operation; calculate a transfer clock frequency; and set the transfer clock frequency.

In another embodiment, a data storage device comprises: a memory device; and a controller coupled to the memory device, wherein the controller is configured to: perform a dummy read from the memory device for a predetermined transfer size; measure a busy time of sensing of the dummy read; calculate a transfer clock frequency; and dynamically adjust the transfer clock frequency for future read operations.

In another embodiment, a data storage device comprises: memory means; and a controller coupled to the memory means, wherein the controller is configured to: receive a read command from a host; determine data transfer parameters associated with the read command and an expected busy time of sensing the data; and adjust a transfer clock frequency so that a transfer time will be less than the expected busy time.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the FIGURES. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to optimizing memory storage performance and power usage. Read operations from flash memory are comprised of a sense operation and a read transfer operation. Usually, these two operations are performed in parallel to achieve high read performance. However, these two operations typically do not take the same amount of time, leading to inefficiencies. By measuring sense busy time, the read transfer clock may be set accordingly so the two operations are equal in time. In so doing, the system will be optimized from both a performance and power consumption point of view.

Figure 1:
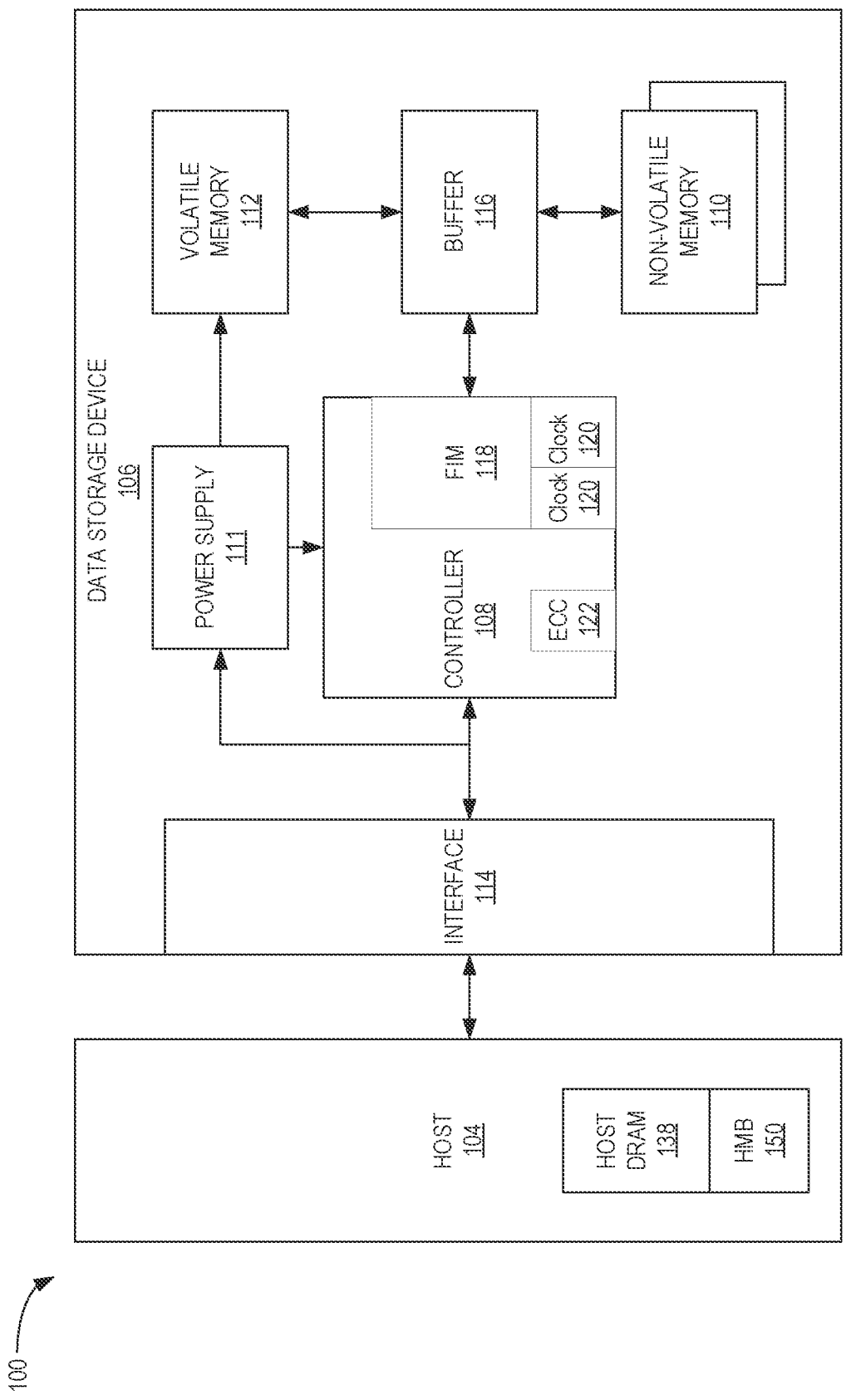
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. Controller 108 contains an error correction code (ECC) module 122 and a flash interface module (FIM) 118 comprising one or more clocks 120 to interact with the NVM 110 for read and write operations. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in an internal memory of the controller 108 (i.e., a second volatile memory), which may be SRAM memory, prior to sending the data to the NVM 110. In some embodiments, the host device 104 has DRAM 138 that includes host memory buffer (HMB) 150 that permits the data storage device 106 to store data therein. In embodiments where HMB 150 is present, the data storage device 106 may or may not have DRAM in the controller 108.

As discussed herein, the data storage device measures the busy time and sets the transfer clock accordingly. The purpose is to have the busy time and the transfer time the same. In so doing, the system will be optimized from both a performance and a power consumption point of view. In system initialization time, the ASIC will perform a dummy read from the memory device (e.g., flash die) and measure the ready/busy (R/B) time for sending, for example, 16k bytes plus error correction code (ECC). Then, the ASIC will calculate the needed clock for having a busy time and transfer time which are the same. The formula for the frequency of the clock is (1/frequency)*16k bytes (+ECC) =busy time. From the formula, the frequency can be calculated after measuring the busy time. In the case of toggle mode (TM), there may be an adjustment of the formula where the transfer rate will be higher.

The formula, while appearing to be quite simple, is not really simple. The amount of data (e.g., 1 plane or 16k bytes) is not constant in the formula. In many cases only 4k bytes+ECC are read because sometimes the whole plane isn't transferred. Additionally, the busy time of different types of senses also changes. The sense time depends on several parameters: die size, silicon process type (i.e., distance between two transistors in a flash array), temperature of die, and other parameters that are defined inside of the flash.

To allow for optimal read performance per the current sense, firmware (FW) will dynamically collect the information about the current transfer size and expected busy time, and calculate the needed transfer clock frequency. Then the FW will set the transfer clock and perform the two operations in parallel (i.e., sense+transfer) as explained above.

The measured time may be adjusted to account for expected error correction and detection. The transfer time that will result from setting the clock should be at least shorter than the sense time by some amount to allow more time for the ECC module to decode the data for efficient data flow. There are cases where the ECC module will need to perform more work due to issues such as program/erase (P/E) being greater than a predetermined threshold. In such a scenario, the transfer time should be even smaller.

For random reads, the transfer time that will result from setting the clock needs to be as short as possible where no cache read operations are expected. For a plurality of dies, (e.g., 4 dies) that are connected to the same FIM, the transfer rate will be a multiple of dies higher (e.g., 4 times higher) than the sense time. If it is not possible to achieve the multiple times ratio (e.g., 4×) then the goal is to achieve the best possible ratio.

Figure 2:
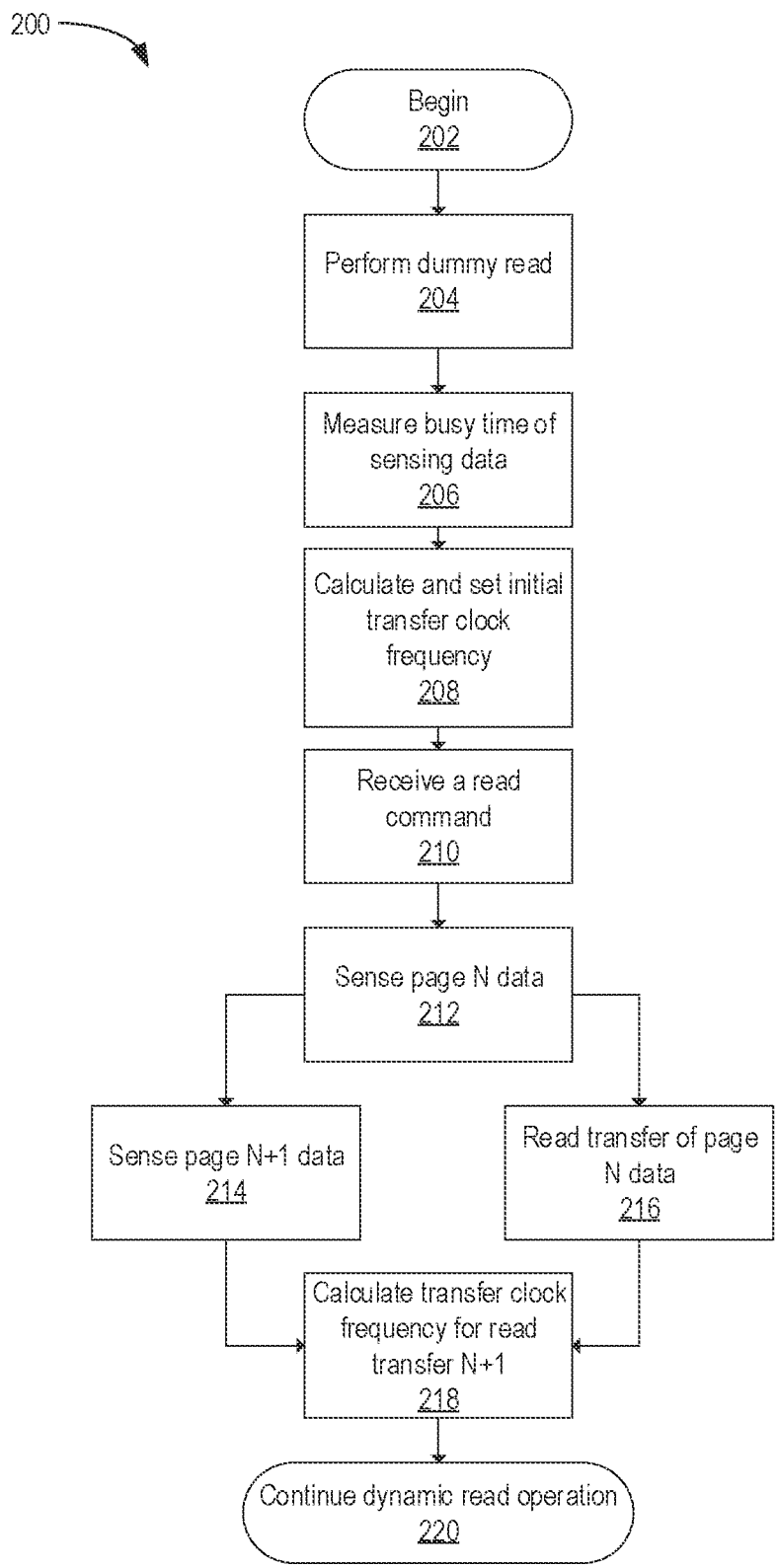
FIG. 2 is a flowchart illustrating a dynamic method of optimizing read operations according to certain embodiments.

FIG. 2 is a flowchart 200 illustrating a dynamic method of optimizing read operations according to certain embodiments. A controller, such as the controller 108 of FIG. 1, begins at block 202 during system initialization. As the flow continues to block 204, the controller performs a dummy read from a flash die. The dummy read involves sensing. The controller measures and records the amount of time the sensing took for a predetermined read size at block 206. In certain embodiments, the read size accounts for Error Correction Codes (ECCs).

Once a busy time has been recorded, the controller calculates and sets a transfer clock frequency at block 208 that allows for a read transfer time to match the recorded busy time from the dummy read. The formula is:

$$\frac{1}{Frequency} \times \text{Transfer size}(+ECC) = \text{Busy time}$$

When the device receives a read command at block 210, the controller determines several parameters of the read. The parameters comprise of the amount of data and ECC, the size of the die being sensed, the silicon process type of the die that is being sensed, and other parameters that are defined inside the flash. The controller then performs the first sense of the read operation for a page N at block 212. Immediately following the first sense, the controller then simultaneously performs a sense for page N+1 data at block 214 while performing a read transfer of the data of page N at block 216.

The controller then calculates a new transfer clock frequency based upon the parameters determined by the controller at block 218. The parameters help to define the variables needed to solve for transfer clock frequency. Then, the controller sets the read transfer clock for the N+1 data. The read operation continues on in parallel at block 220, while continuing to dynamically collect information and calculate new frequencies to match transfer and sense times until the read operation is finished.

Figure 3:
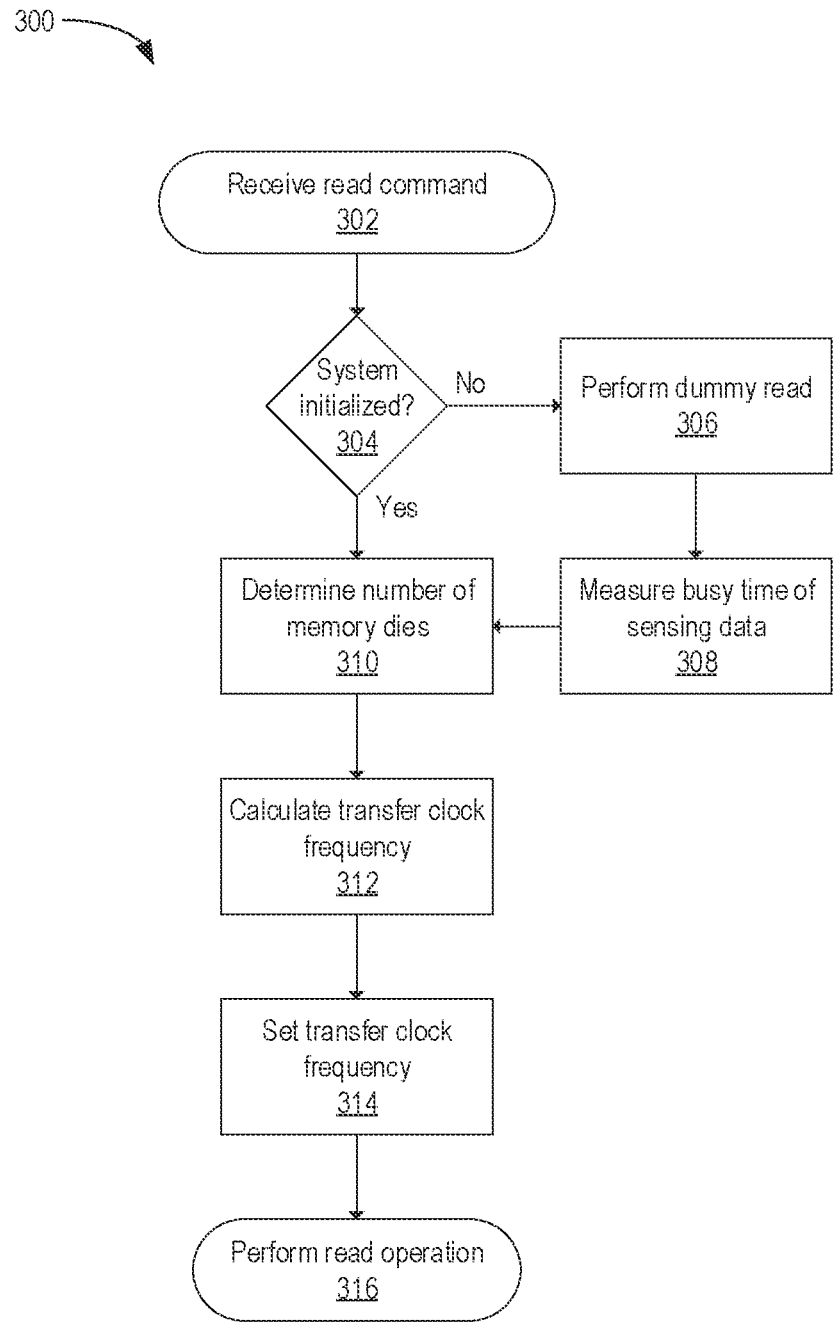
FIG. 3 is a flowchart illustrating read transfer synchronization with one or more memory dies and one transfer clock.

FIG. 3 is a flowchart 300 illustrating read transfer synchronization with one or more memory dies and one transfer clock according to certain embodiments. The flow begins at block 302, when the data storage device receives a read command from a host device. First, the data storage device checks if the system is initialized at block 304. If the data storage device has not been initialized, the data storage device performs a dummy read from flash memory at block 306. The data storage device measures and records the amount of time required to sense the data during the dummy read at block 308.

Either after system initialization is finished or if initialization was already complete, the flow proceeds to block 310, where the data storage device determines the number of memory dies involved with the read transfer operation. Then at block 312, the data storage device calculates the transfer clock frequency needed to complete the read transfers for each memory die involved in the read operation serially while simultaneously performing the sense in parallel. For example, if the data from the read request will need to be transferred to four memory dies, the calculated clock frequency must accomplish each die transfer four times faster than the sense time in order to complete all the transfers at the same time as the sense. If the transfer rate is too high and cannot be achieved by the device, then the transfer clock is set to a maximum value. The data storage device then sets the calculated clock frequency at block 314. Finally, at block 316, the data storage device performs the read operation.

Figure 4:
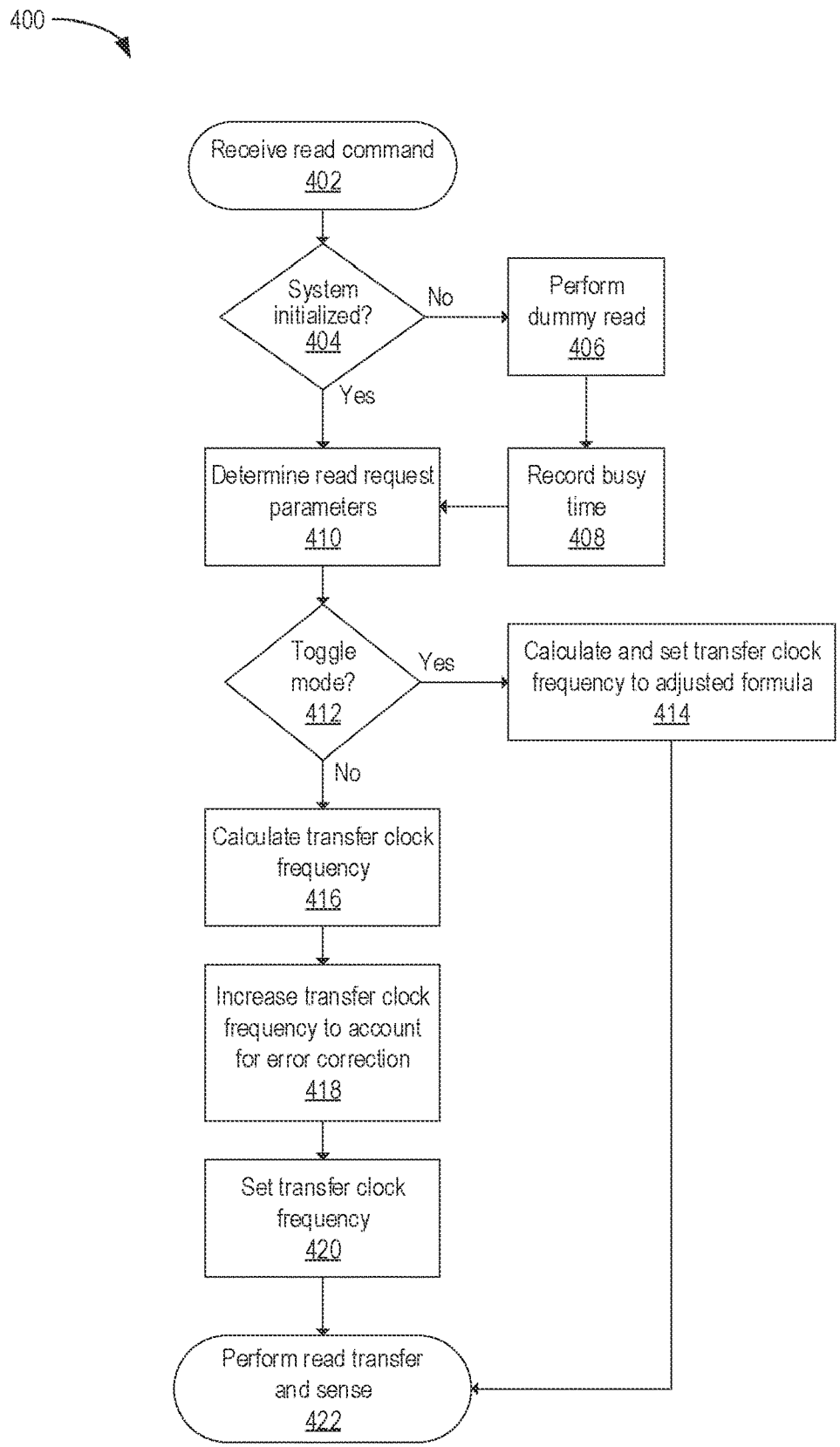
FIG. 4 is a flowchart illustrating read transfer optimization while accounting for system factors according to certain embodiments.

FIG. 4 is a flowchart 400 illustrating read transfer optimization while accounting for system factors according to certain embodiments. The flow begins with the data storage device receiving a read command from a host device at block 402. The data storage device first determines if the system has been initialized at block 404. The system has been initialized in this instance if the system has already performed a dummy read and has a recorded busy time for sensing data from flash memory. If the system has not been initialized, the flow proceeds to block 406, where the data storage device performs a dummy read of a predetermined transfer size. The data storage device records the busy time of the sense operation at block 408.

After system initialization, the data storage device determines a variety of parameters of the read request at block 410. These parameters comprise include transfer sizes, flash memory die size, flash memory silicon process type, and Error Correction Code (ECC) size. The data storage device then determines if the data storage device is in a toggle mode (TM) at block 412. During TM, the data transfer speeds need to be increased to achieve the performance desired. Therefore, the formula to calculate a frequency can be adjusted to account for the increased performance desired while in TM. At block 414, if the data storage device is in TM, the data storage device uses an adjusted formula to calculate and set the needed transfer clock frequency. With the transfer clock frequency set, the data storage device performs the read transfer and sense in parallel at block 422.

If the data storage device is not in TM, the flow proceeds to block 416. There, the data storage device calculates the transfer clock frequency needed to complete the read transfer and sense in the same amount of time. The data storage device then increases the calculated clock frequency by a margin to account for any expected time for error correction. The data storage device can expect greater times for error correction once a program/erase threshold has been met. The data storage device then sets the adjusted transfer clock frequency at block 420. And finally, at block 422, the data storage device performs the read transfer and sense in parallel.

Optimization of performance for flash memory storage while performing read operations can be achieved by adjusting the transfer clock frequency based upon an expected busy time. In so doing, it is possible to achieve optimal settings to allow high read performance and the lowest possible power consumption in a read operation.

In one embodiment, a data storage device comprises: a memory device; and a controller coupled to the memory device, wherein the controller is configured to: collect information about current transfer size of a read operation; determine an expected busy time, wherein the expected busy time is a time to perform a sense operation; calculate a transfer clock frequency; and set the transfer clock frequency. The collecting information is a dynamic process of collecting current transfer size and expected busy time per current sense. The expected busy time depends upon several parameters including die size, silicon process type, and other parameters defined inside flash memory. The calculating and setting the transfer clock frequency occurs per sense. The transfer clock frequency of at least one memory die is different than a transfer clock frequency of at least one other die. Calculating the transfer clock frequency is determined individually per the at least one memory die, wherein a total combined transfer time of the at least one memory die is equal to the expected busy time. The calculating the transfer clock frequency comprises a toggle mode, wherein the transfer clock frequency is set to a maximum possible frequency while the toggle mode is active. Collecting information about the current transfer size comprises adding a size of read data and a size of error correction data associated with the read data. Determining an expected busy time comprises identifying a random read operation and setting the expected busy time to a minimum value.

In another embodiment, a data storage device comprises: a memory device; and a controller coupled to the memory device, wherein the controller is configured to: perform a dummy read from the memory device for a predetermined transfer size; measure a busy time of sensing of the dummy read; calculate a transfer clock frequency; and dynamically adjust the transfer clock frequency for future read operations. Performing the dummy read comprises performing a dummy operation for expected varieties of future operations, wherein a busy time for each dummy read performed is recorded in a table. Dynamically adjusting the transfer clock frequency for future read operations comprises calculating a second transfer clock frequency for a second read operation based upon transfer size of the second read operation. Calculating the transfer clock frequency comprises determining transfer size and error correction size of a current read operation to calculate the transfer clock frequency to match expected busy time. The data storage device further comprises a plurality of memory devices coupled to the controller. The plurality of memory devices are coupled to one or more transfer clocks.

In another embodiment, a data storage device comprises: memory means; and a controller coupled to the memory means, wherein the controller is configured to: receive a read command from a host; determine data transfer parameters associated with the read command and an expected busy time of sensing the data; and adjust a transfer clock frequency so that a transfer time will be less than the expected busy time. The data storage device further comprises an Error Correction Code (ECC) module for decoding read data. The data transfer parameters associated with the read command and an expected busy time of sensing the data comprises current transfer size, ECC size, die size, and silicon process type. Adjusting the transfer clock frequency so that the transfer time will be less than the expected busy time comprises shortening the transfer time by an amount of time for the ECC module to decode the data. The controller is further configured to determine when a program erase cycle is over a threshold and adjust the transfer clock frequency to be less by a greater amount to allow more time for the ECC module to decode.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, wherein the controller is configured to:
collect information about current transfer size of a read operation;
determine an expected busy time, wherein the expected busy time is a time to perform a sense operation;
calculate a transfer clock frequency; and
set the transfer clock frequency, wherein the transfer clock frequency of at least one memory die is different than a transfer clock frequency of at least one other die, wherein calculating the transfer clock frequency is determined individually per the at least one memory die, wherein a total combined transfer time of the at least one memory die is equal to the expected busy time.

2. The data storage device of claim 1, wherein the collecting information is a dynamic process of collecting current transfer size and expected busy time per current sense.

3. The data storage device of claim 2, wherein the expected busy time depends upon several parameters including die size, silicon process type, and other parameters defined inside flash memory.

4. The data storage device of claim 1, wherein the calculating and setting the transfer clock frequency occurs per sense.

5. A data storage device, comprising:
a memory device; and
a controller coupled to the memory device, wherein the controller is configured to:
perform a dummy read from the memory device for a predetermined transfer size;
measure a busy time of sensing of the dummy read;
calculate a transfer clock frequency; and
dynamically adjust the transfer clock frequency for future read operations, wherein performing the dummy read comprises performing a dummy operation for expected varieties of future operations, wherein a busy time for each dummy read performed is recorded in a table.

6. The data storage device of claim 1, wherein the calculating the transfer clock frequency comprises a toggle mode, wherein the transfer clock frequency is set to a maximum possible frequency while the toggle mode is active.

7. The data storage device of claim 1, wherein collecting information about the current transfer size comprises adding a size of read data and a size of error correction data associated with the read data.

8. The data storage device of claim 1, wherein determining an expected busy time comprises identifying a random read operation and setting the expected busy time to a minimum value.

9. The data storage device of claim 1, wherein the controller is further configured to adjust a transfer clock frequency so that a transfer time will be less than the expected busy time.

10. The data storage device of claim 1, wherein the busy time is calculated according to the following formula: (1/Frequency)*Transfer size(+ECC)=busy time.

11. The data storage device of claim 5, wherein dynamically adjusting the transfer clock frequency for future read operations comprises calculating a second transfer clock frequency for a second read operation based upon transfer size of the second read operation.

12. The data storage device of claim 5, wherein calculating the transfer clock frequency comprises determining transfer size and error correction size of a current read operation to calculate the transfer clock frequency to match expected busy time.

13. The data storage device of claim 5, wherein the data storage device further comprises a plurality of memory devices coupled to the controller.

14. The data storage device of claim 13, wherein the plurality of memory devices are coupled to one or more transfer clocks.

15. A data storage device, comprising:
memory means; and
a controller coupled to the memory means, wherein the controller is configured to:
receive a read command from a host;
determine data transfer parameters associated with the read command and an expected busy time of sensing the data; and
adjust a transfer clock frequency so that a transfer time will be less than the expected busy time.

16. The data storage device of claim 15, wherein the data storage device further comprises an Error Correction Code (ECC) module for decoding read data.

17. The data storage device of claim 16, wherein the data transfer parameters associated with the read command and an expected busy time of sensing the data comprises current transfer size, ECC size, die size, and silicon process type.

18. The data storage device of claim 16, wherein adjusting the transfer clock frequency so that the transfer time will be less than the expected busy time comprises shortening the transfer time by an amount of time for the ECC module to decode the data.

19. The data storage device of claim 18, wherein the controller is further configured to determine when a program erase cycle is over a threshold and adjust the transfer clock frequency to be less by a greater amount to allow more time for the ECC module to decode.

20. The data storage device of claim 5, wherein the dynamically adjusting comprises adjusting a transfer clock frequency so that a transfer time will be less than the expected busy time.

* * * * *